US007029998B2

United States Patent
Park

(10) Patent No.: US 7,029,998 B2
(45) Date of Patent: Apr. 18, 2006

(54) FORMATION METHOD OF GATE ELECTRODE IN A SEMICONDUCTOR PROCESS

(75) Inventor: Geon-Ook Park, Seoul (KR)

(73) Assignee: DongbuAnam Semiconductor Inc., Seoul (KR)

( * ) Notice: Subject to any disclaimer, the term of this patent is extended or adjusted under 35 U.S.C. 154(b) by 186 days.

(21) Appl. No.: 10/739,202

(22) Filed: Dec. 19, 2003

(65) Prior Publication Data

US 2004/0132273 A1  Jul. 8, 2004

(30) Foreign Application Priority Data

Dec. 20, 2002  (KR) .................. 10-2002-0082001

(51) Int. Cl.
*H01L 21/31* (2006.01)
(52) U.S. Cl. ....................... 438/585; 438/587
(58) Field of Classification Search ............. 438/588, 438/587, 585
See application file for complete search history.

(56) References Cited

U.S. PATENT DOCUMENTS

| | | | |
|---|---|---|---|
| 4,287,660 A * | 9/1981 | Nicholas | 438/279 |
| 4,358,340 A * | 11/1982 | Fu | 438/585 |
| 4,939,071 A * | 7/1990 | Barrera et al. | 430/314 |
| 5,776,821 A * | 7/1998 | Haskell et al. | 438/585 |
| 5,965,461 A | 10/1999 | Yang et al. | |
| 6,087,238 A * | 7/2000 | Gardner et al. | 438/304 |
| 6,103,605 A * | 8/2000 | Hopper | 438/585 |
| 6,107,172 A | 8/2000 | Yang et al. | |
| 6,165,881 A | 12/2000 | Tao et al. | |
| 6,204,130 B1 * | 3/2001 | Gardner et al. | 438/287 |
| 6,225,201 B1 * | 5/2001 | Gardner et al. | 438/585 |
| 6,271,113 B1 * | 8/2001 | Yoon et al. | 438/618 |
| 6,362,111 B1 * | 3/2002 | Laaksonen et al. | 438/725 |
| 6,420,097 B1 | 7/2002 | Pike et al. | |
| 6,541,360 B1 * | 4/2003 | Plat et al. | 438/585 |
| 6,576,536 B1 * | 6/2003 | Babcock | 438/585 |
| 6,753,266 B1 * | 6/2004 | Lukanc et al. | 438/739 |
| 6,759,180 B1 * | 7/2004 | Lee | 430/313 |
| 6,759,315 B1 * | 7/2004 | Furukawa et al. | 438/585 |
| 6,794,230 B1 * | 9/2004 | Huang et al. | 438/154 |
| 6,849,530 B1 * | 2/2005 | Bonser et al. | 438/585 |
| 2003/0124847 A1 * | 7/2003 | Houston et al. | 438/689 |
| 2003/0129815 A1 * | 7/2003 | Doyle et al. | 438/585 |

* cited by examiner

*Primary Examiner*—Evan Pert
(74) *Attorney, Agent, or Firm*—Pillsbury Winthrop Shaw Pittman LLP

(57) ABSTRACT

The present invention is directed to a method of forming a gate electrode in a semiconductor device, which is capable of reducing a line width of the gate electrode by performing a photolithography process after defining a wide region on which a gate electrode is located on a photoresist twice such that the line width of the gate electrode is not subject to a wavelength of a light source used when the photolithography process is performed. The method comprises forming a gate oxide on a semiconductor substrate, depositing a polysilicon on the gate oxide, forming a mask thin film on the polysilicon, patterning the mask thin film using a photolithography process twice, wherein one photolithography process is performed with a mask pattern which masks neighboring gate electrode areas and an area between the neighboring gate electrode areas, another photolithography process is performed with a mask pattern which exposes the area between the neighboring gate electrode areas, etching the polysilicon using the mask thin film pattern, and removing the mask thin film pattern on the polysilicon.

10 Claims, 3 Drawing Sheets

FORMATION METHOD OF GATE ELECTRODE IN A SEMICONDUCTOR PROCESS

BACKGROUND OF THE INVENTION (a) Field of the Invention

The present invention relates to a method of fabricating a semiconductor device, and more particularly to a method of forming a gate electrode in a semiconductor device, which is capable of reducing a line width of the gate electrode.

(b) Description of the Related Art

With the development of manufacturing techniques for semiconductor devices and the expansion of their applications, research and development into increased integration of semiconductor devices has progressed rapidly. Also, with the increased integration of semiconductor devices, studies for downsizing semiconductors based on microscopic process technologies have progressed.

With the downsizing of semiconductor devices, an adjustment of gate CD (critical dimension), which can be referred to as the width of gate, is very important. This is because a transistor driving current varies greatly depending on a variation of the gate CD.

Conventionally, in implementing a gate electrode, by defining a region on which a gate electrode is located on a photoresist once when a photolithography process is performed, a line width of the gate electrode is limited by a light source used in the photolithography process.

Techniques related to the method of forming the gate electrode are disclosed in U.S. Pat. Nos. 6,420,097, 6,165, 881, 6,107,175, and 5,965,461.

Hereinafter, a conventional general method of forming a gate electrode will be described with reference to FIGS. 1A and 1B.

A gate oxide 2 is formed on a silicon substrate 1, a polysilicon 3 to function as a gate electrode later is deposited on the gate oxide 2, and then a photoresist 4 is patterned by using a photolithography process in order to define the gate electrode.

At this time, the photolithography process is progressed such that a pattern of photoresist 4 exists on only a region on which the gate electrode is to be formed (i.e. gate electrode 10 not yet patterned as depicted in FIG. 1). Also, a line width of the pattern of photoresist 4 is limited by a wavelength of a light source used when the photolithography process is progressed. A wavelength band includes multiple wavelengths of differing lengths, and the line width of the pattern can be more reduced as the wavelength becomes shorter. Conventionally, the wavelength of 248 nm or 193 nm was used, limiting the line width of the pattern to about 0.13 μm.

Based on the pattern of the photoresist as formed above, the polysilicon 3 is etched so that a desired gate electrode 3a is formed.

However, since the line width of the gate electrode, which is the most narrow line width of all line widths of elements in the semiconductor device, is destined to be limited by the wavelength of the light source used when the photolithography process is performed, an overall size of the semiconductor device is also limited.

Accordingly, an integration of the semiconductor device is faced with a limit.

SUMMARY OF THE INVENTION

In consideration of the above problem, it is an object of the present invention to provide a method of forming a gate electrode in a semiconductor device, which is capable of reducing a line width of the gate electrode by performing a photolithography process after defining a wide region on which a gate electrode is located on a photoresist twice such that the line width of the gate electrode is not subject to a wavelength of a light source used when the photolithography process is performed.

To achieve the object, according to an aspect of the present invention, a method of forming a gate electrode in a semiconductor device comprises forming a gate oxide on a semiconductor substrate, depositing a polysilicon on the gate oxide, forming thin mask formation film on the polysilicon, patterning the mask formation film using a photolithography process twice, wherein one photolithography process is performed with a mask pattern which masks neighboring gate electrode areas and an area between the neighboring gate electrode areas, another photolithography process is performed with a mask pattern which exposes the area between the neighboring gate electrode areas, etching the polysilicon using the mask thin film pattern, and removing the mask formation film pattern on the polysilicon.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENT

A preferred embodiment of the present invention will now be described in detail with reference to the accompanying drawings.

FIGS. 2A to 2E are sectional views showing a process of forming a gate electrode in a semiconductor device according to the present invention.

According to a method of forming a gate electrode according to the present invention, a line width of the gate electrode can be microscopically formed by performing a photolithography process twice.

One photolithography process is performed with a mask pattern which masks neighboring gate electrode areas and an area between the neighboring gate electrode areas. Another photolithography process is performed with a mask pattern which exposes the area between the neighboring gate electrode areas. And then, gate electrode etching is performed by the mask that is formed by a photolithography process twice.

Figure 1A:
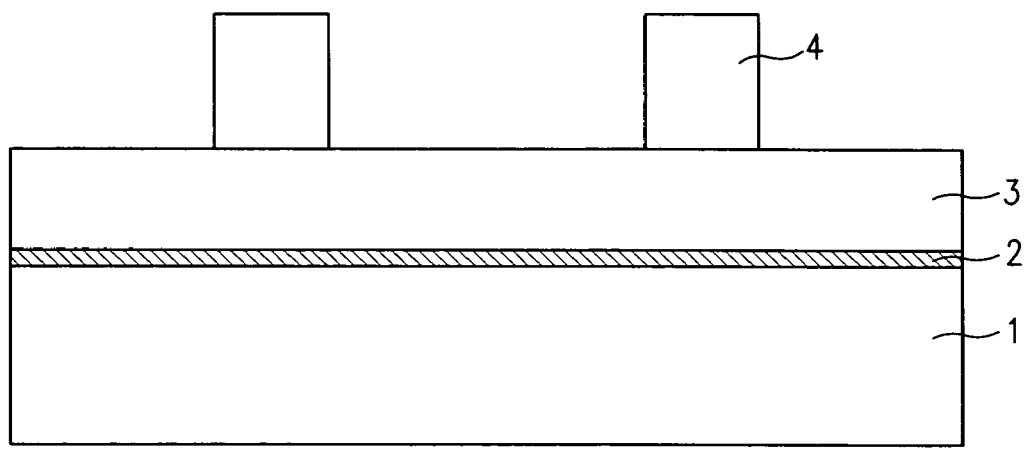
FIGS. 1A and 1B are sectional views showing a process of forming a gate electrode in a conventional semiconductor device.
Figure 1B:
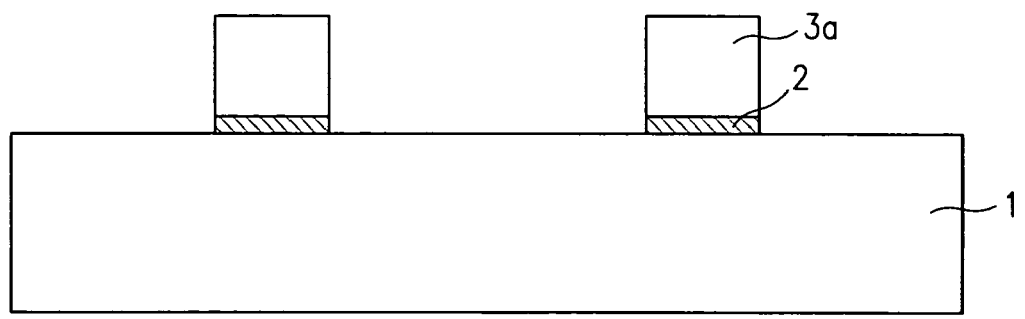
Figure 2A:
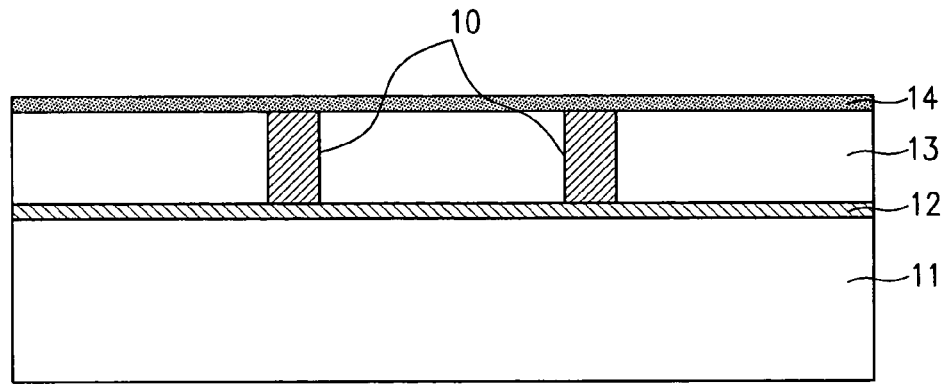
FIGS. 2A to 2E are sectional views showing a process of forming a gate electrode in a semiconductor device according to the present invention.

To accomplish this, first, as shown in FIG. 2A, a gate oxide 12 is formed on a silicon substrate 11, a polysilicon 13 to function as a gate electrode is deposited on the gate oxide 12, and then a mask formation film 14 to be used as a gate etching mask when a gate electrode is etched from the polysilicon after patterning the mask formation film.

At this time, the mask formation film 14 is preferably a material having a great difference in etching rate from the polysilicon 13, for example, silicon oxynitride or silicon nitride through a PECVD method. Since the mask thin film 14 made from silicon oxynitride or silicon nitride has a great difference in etching rate from the polysilicon 13, it exists on the gate electrode until the polysilicon is completed to be etched later.

Figure 2B:
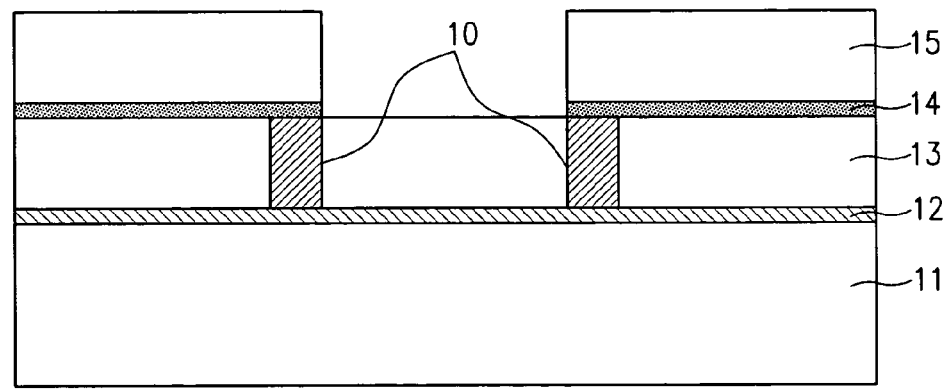

Then, as shown in FIG. 2B, in a step of performing a first etching process, a first pattern of photoresist 15 is formed on the mask thin film 14 to be used as a curing mask by using photolithography process. Based on the first pattern of photoresist 15, the mask thin film 14 is etched until the polysilicon 13 is exposed. At this time, as described above, since the mask thin film 14 has a great difference in etching rate from the polysilicon 13, the polysilicon 13 can be etched without any damage.

Consequently, the region on which the gate electrode is to be formed remains below the first pattern of photoresist 15. Then, the first pattern of photoresist 15 is removed.

Figure 2C:
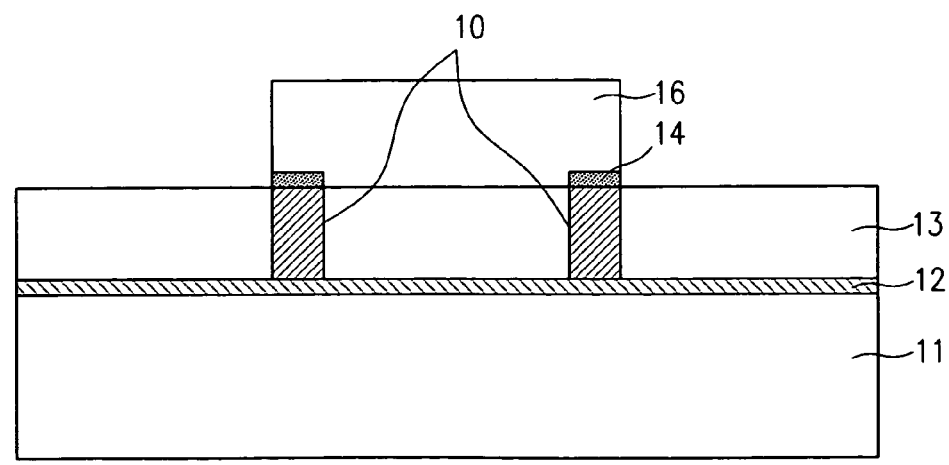

Next, as shown in FIG. 2C, in a step of performing a second etching process after the first pattern of photoresist 15 is removed, a second pattern of photoresist 16 is formed. At this time, the second pattern of photoresist 16 partially overlaps with a portion where the first pattern of photoresist 15 is formed. The polysilicon below this overlapped portion is a portion remaining as the gate electrode through a subsequent process.

Then, based on the second pattern of photoresist 16, the mask thin film 14, which has been not yet etched, is etched away until the polysilicon 13 is exposed.

When the polysilicon 13 is exposed, the etching process is ended and the second pattern of photoresist 16 used as the mask is removed. Consequently, only the mask thin film 14 corresponding to a width of the gate electrode remains on the polysilicon 13.

Figure 2D:
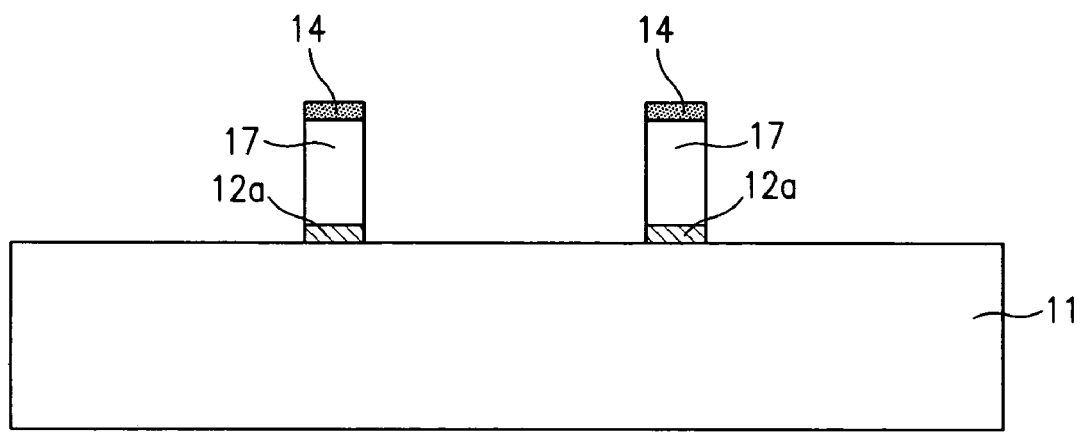

In a subsequent step of etching the polysilicon, as shown in FIG. 2D, the polysilicon 13 is etched by using only the mask thin film 14 remaining on the polysilicon 13.

In other words, since the mask thin film 14 made from silicon oxynitride or silicon nitride is less etched than the polysilicon is, when the etching process is progressed considering that the mask thin film 14 is minutely etched, the polysilicon 13 and the silicon oxide 12a are etched, leaving the mask thin film 12 as it is, until the silicon substrate 11 is exposed.

Figure 2E:
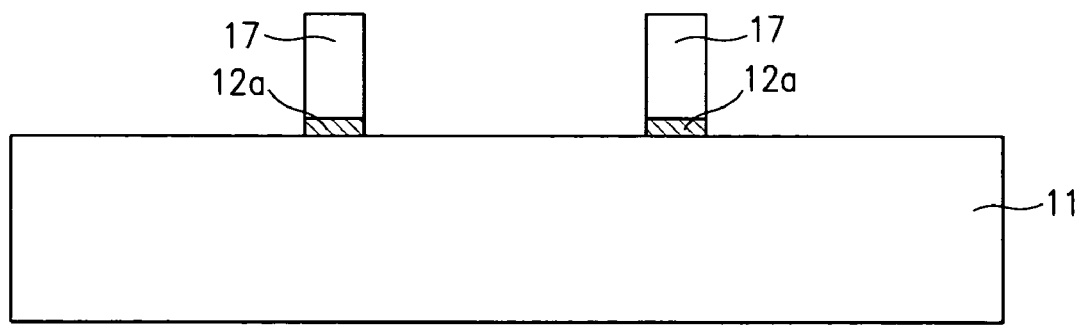

Finally, as shown in FIG. 2E, in a step of forming the gate electrode, the gate electrode 17 is formed by removing the mask thin film made from silicon oxynitride or silicon nitride on the remaining polysilicon using a wet etching.

As apparent from the above description, according to the present invention, by performing an etching process twice for the mask thin film using patterns of photoresist formed in a partially overlapped manner with a difference in time such that the gate electrode with an ultramicroscopic line width is formed in the overlapped portion, an overall size of the device can be reduced. Accordingly, the number of devices producible from one wafer increases greatly, which result in the increase of an overall wafer yield.

Although a preferred embodiment of the present invention has been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A method of forming a gate electrode in a semiconductor device, comprising the steps of:
    forming a gate oxide on a semiconductor substrate;
    depositing polysilicon on the gate oxide;
    forming a mask formation film on the polysilicon;
    patterning the mask formation film twice, using a photolithography process for each patterning, wherein one photolithography process is performed with a mask pattern which masks neighboring gate electrode areas and an area between the neighboring gate electrode areas, and the other photolithography process is performed with a mask pattern which exposes the area between the neighboring gate electrode areas;
    etching the polysilicon using the patterned mask formation film; and
    removing mask formation film remaining on the polysilicon.

2. The method of claim 1, wherein the mask formation film is patterned by a photolithography process with a mask pattern which masks neighboring gate electrode areas and the area between the neighboring gate electrode areas, and then by a photolithography process with a mask pattern which exposes the area between the neighboring gate electrode areas.

3. The method of claim 1, wherein the mask formation film is patterned by a photolithography process with a mask pattern which exposes the area between the neighboring gate electrode areas, and then by a photolithography process with a mask pattern which masks neighboring gate electrode areas and the area between neighboring gate electrode areas.

4. The method of claim 1, wherein the mask formation film is made from material having a great difference in etching rate from the polysilicon.

5. The method of claim 4, wherein the mask formation film is silicon oxynitride or silicon nitride.

6. A method of forming a gate electrode in a semiconductor device, comprising the steps of:
    forming a gate oxide on a silicon substrate;
    depositing polysilicon to function as a gate electrode on the gate oxide, and then forming a mask formation film to be used as a mask when the gate electrode is etched from the polysilicon,
    forming a first pattern of photoresist on the mask formation film, and then performing a first etching step of etching the mask formation film based on the first pattern of photoresist;
    removing the first pattern of photoresist;
    forming a second pattern of photoresist on a portion of the mask formation film remaining after the first etching step and on the polysilicon, and then performing a second etching step of etching the mask formation film based on the second pattern of photoresist;
    removing the second pattern of photoresist, and then etching the polysilicon using the mask formation film partially remaining on the polysilicon; and
    forming the gate electrode by removing the mask formation film remaining on the polysilicon.

7. The method of claim 6, wherein the mask formation film is made from material having a great difference in etching rate from the polysilicon.

8. The method of claim 1 or 7, wherein the mask formation film is a film of silicon oxynitride or silicon nitride deposited by a PECVD method.

9. The method of claim 6, wherein the etching of the mask formation film in the first and second etching steps is performed until the polysilicon is exposed.

10. The method of claim 6, wherein, in the step of forming the gate electrode, the mask formation film is removed by a wet etching.

* * * * *